United States Patent
Santos Rodriguez et al.

(10) Patent No.: US 11,107,732 B2
(45) Date of Patent: Aug. 31, 2021

(54) METHODS FOR PROCESSING A WIDE BAND GAP SEMICONDUCTOR WAFER, METHODS FOR FORMING A PLURALITY OF THIN WIDE BAND GAP SEMICONDUCTOR WAFERS, AND WIDE BAND GAP SEMICONDUCTOR WAFERS

(71) Applicant: Infineon Technologies AG, Neubiberg (DE)

(72) Inventors: Francisco Javier Santos Rodriguez, Villach (AT); Guenter Denifl, Annenheim (AT); Tobias Franz Wolfgang Hoechbauer, Villach (AT); Martin Huber, Villach (AT); Wolfgang Lehnert, Lintach (DE); Roland Rupp, Lauf (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/410,724

(22) Filed: May 13, 2019

(65) Prior Publication Data

US 2019/0348328 A1    Nov. 14, 2019

(30) Foreign Application Priority Data

May 14, 2018   (DE) .......................... 102018111450.8

(51) Int. Cl.
*H01L 21/78* (2006.01)
*H01L 21/02* (2006.01)

(52) U.S. Cl.
CPC .... *H01L 21/7813* (2013.01); *H01L 21/02016* (2013.01)

(58) Field of Classification Search
CPC ........... H01L 21/02002; H01L 21/7813; H01L 21/7806; H01L 21/02016; H01L 21/18;
(Continued)

(56) References Cited

U.S. PATENT DOCUMENTS

2002/0096106 A1    7/2002   Kub et al.
2003/0153163 A1    8/2003   Letertre et al.
(Continued)

FOREIGN PATENT DOCUMENTS

DE    102016014821 A1    6/2018
WO    2010072675 A2    7/2010

OTHER PUBLICATIONS

Swoboda, Marko, et al., "Laser Assisted SiC Wafering Using Cold Split", Materials Science Forum, vol. 897, 2016 European Conference on Silicon Carbide & Related Materials (ECSCRM), Sep. 25-29, 2016, pp. 403-406.

*Primary Examiner* — Thanh T Nguyen
(74) *Attorney, Agent, or Firm* — Murphy, Bilak & Homiller, PLLC

(57) ABSTRACT

A method for processing a wide band gap semiconductor wafer is proposed. The method includes depositing a non-monocrystalline support layer at a back side of a wide band gap semiconductor wafer, depositing an epitaxial layer at a front side of the wide band gap semiconductor wafer, and splitting the wide band gap semiconductor wafer along a splitting region to obtain a device wafer including at least a part of the epitaxial layer, and a remaining wafer including the non-monocrystalline support layer.

19 Claims, 3 Drawing Sheets

(58) Field of Classification Search
CPC ....... H01L 21/185; H01L 29/02; H01L 21/20; C30B 29/36; C30B 33/06; C30B 25/20
See application file for complete search history.

(56) References Cited

U.S. PATENT DOCUMENTS

| | | |
|---|---|---|
| 2006/0099776 A1 | 5/2006 | Dupont |
| 2016/0093763 A1* | 3/2016 | Rana .................. H01L 31/0682 438/57 |
| 2016/0104622 A1* | 4/2016 | Oefner .............. H01L 29/66348 257/758 |
| 2017/0278930 A1 | 9/2017 | Ruhl et al. |
| 2017/0372965 A1* | 12/2017 | Nishibayashi .... H01L 21/02527 |
| 2018/0076321 A1* | 3/2018 | Goller ................. H01L 29/4236 |

* cited by examiner

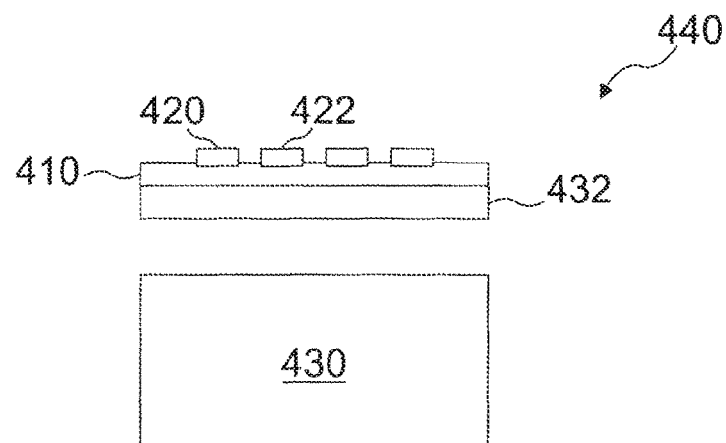
FIG. 4d
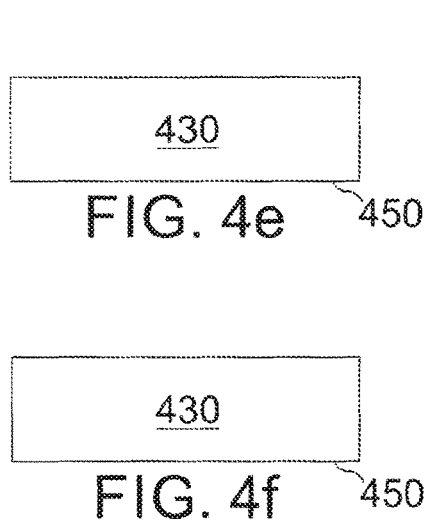
FIG. 4e
FIG. 4f
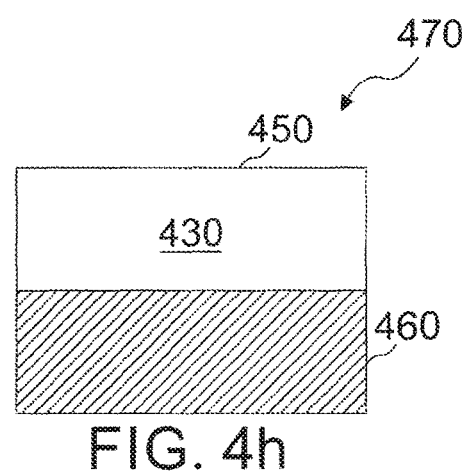
FIG. 4h
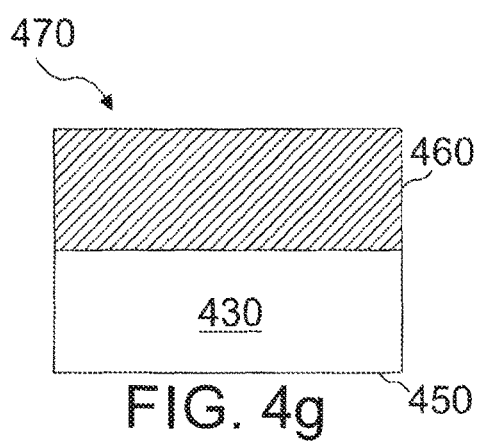
FIG. 4g
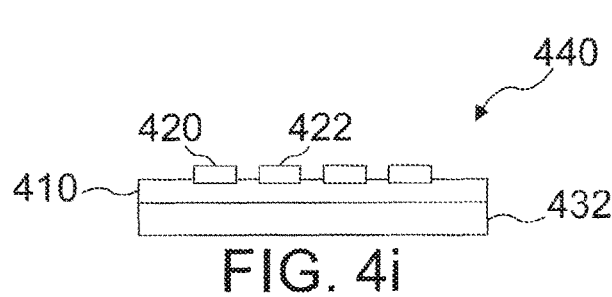
FIG. 4i

METHODS FOR PROCESSING A WIDE BAND GAP SEMICONDUCTOR WAFER, METHODS FOR FORMING A PLURALITY OF THIN WIDE BAND GAP SEMICONDUCTOR WAFERS, AND WIDE BAND GAP SEMICONDUCTOR WAFERS

TECHNICAL FIELD

Examples relate to methods for processing a wide band gap semiconductor wafer, to methods for forming a plurality of thin wide band gap semiconductor wafers, and to wide band gap semiconductor wafers.

BACKGROUND

Thin semiconductor wafers, for example of a thickness of less than 250 µm, may show a wafer bow or warp. Consequently, it might not be possible to process thin semiconductor wafers fully automatically as process equipment might not be able to handle such thin semiconductor wafers. Semiconductor wafers may be thinned by wafer splitting, for example to enable reuse.

SUMMARY

An example relates to a method for processing a wide band gap semiconductor wafer. A non-monocrystalline support layer is deposited at a back side of a wide band gap semiconductor wafer. Further, an epitaxial layer is deposited at a front side of the wide band gap semiconductor wafer. The method comprises splitting the wide band gap semiconductor wafer along a splitting region to obtain a device wafer comprising at least a part of the epitaxial layer, and to obtain a remaining wafer comprising the non-monocrystalline support layer.

An example relates to a method for forming a plurality of thin wide band gap semiconductor wafers. The method comprises depositing a first non-monocrystalline support layer on a wide band gap semiconductor boule. The wide band gap semiconductor boule is separated along a first separating region to obtain a first thin wide band gap semiconductor wafer comprising the non-monocrystalline support layer and a thin wide band gap semiconductor layer, and to obtain a first remaining wide band gap semiconductor boule. For example, a thickness of the wide band gap semiconductor boule is at least 2 times a thickness of the thin wide band gap semiconductor layer. A further non-monocrystalline support layer is deposited on the first remaining wide band gap semiconductor boule. The first remaining wide band gap semiconductor boule is separated along a further separating region to obtain a further thin wide band gap semiconductor wafer and to obtain a remaining wide band gap semiconductor boule.

An example relates to a wide band gap semiconductor wafer. The wide band gap semiconductor wafer comprises a monocrystalline wide band gap semiconductor layer. A thickness of the monocrystalline wide band gap semiconductor layer is at least 250 µm. The wide band gap semiconductor wafer further comprises a non-monocrystalline support layer located at a surface of the monocrystalline semiconductor substrate. A thickness of the non-monocrystalline support layer is at least 150 µm. A thermal expansion coefficient of the non-monocrystalline support layer differs from a thermal expansion coefficient of the monocrystalline wide band gap semiconductor layer by at most 5% of the thermal expansion coefficient of the monocrystalline wide band gap semiconductor layer.

BRIEF DESCRIPTION OF THE FIGURES

Some examples of apparatuses and/or methods will be described in the following by way of example only, and with reference to the accompanying figures, in which

FIGS. 4a to 4i show an example of a method for processing a wide band gap semiconductor wafer.

DETAILED DESCRIPTION

Figure 1:
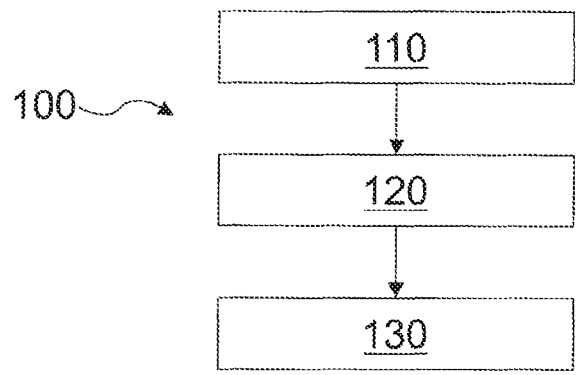
FIG. 1 shows a flow chart of a method for processing a wide band gap semiconductor wafer.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Hereinafter, a "semiconductor boule" may be a semiconductor ingot and/or a thick semiconductor wafer. For example, a semiconductor boule may have the shape of an elongated rod or an elongated bar. A thick semiconductor wafer may have the shape of a disc or a cylinder. A thickness of a thick semiconductor wafer may be at least 2 mm. Furthermore, a "semiconductor wafer" may be a disc of a semiconductor material. A thickness of said disc may be at least one order of magnitude, for example at least two orders of magnitude, smaller than an extension of said disc perpendicular to a thickness. In the case of a thick semiconductor wafer, the thickness may be approximately one order of magnitude smaller than the extension of the thick semiconductor wafer perpendicular to the thickness.

FIG. 1 shows a flow chart of an embodiment of a method 100 for processing a wide band gap semiconductor wafer. The method 100 may comprise depositing 110 a non-monocrystalline support layer on the wide band gap semiconductor wafer. For example, the non-monocrystalline support layer is deposited 110 at a back side of the wide band gap semiconductor wafer. The non-monocrystalline support layer may be a crystalline layer, e.g. a polycrystalline layer or an amorphous layer. The non-monocrystalline support layer may comprise semiconductor material, e.g. a wide band gap semiconductor. For example, the non-monocrystalline support layer may be deposited directly on a back side surface of the wide band gap semiconductor wafer. Alternatively, an intermediate layer may be formed between the non-monocrystalline support layer and the back side surface of the wide band gap semiconductor wafer.

For example, the method 100 may comprise depositing 120 an epitaxial layer at a front side of the wide band gap semiconductor wafer opposite to the back side of the wide band gap semiconductor wafer. The epitaxial layer may be epitaxially grown directly on a front side surface of the wide band gap semiconductor wafer, for example. For example, only the wide band gap semiconductor wafer may be located between the non-monocrystalline support layer and the epitaxial layer. For example, the epitaxial layer may be grown on a same wide band gap semiconductor material as the non-monocrystalline support layer. For example, the epitaxial layer may be grown directly on a monocrystalline portion of the wide band gap semiconductor wafer, for example.

The method 100 may further comprise splitting 130 the wide band gap semiconductor wafer along a splitting region. Splitting 130 may be performed to obtain a device wafer comprising at least a part of the epitaxial layer. For example, the splitting region may be located within the epitaxial layer so that only a part of the epitaxial layer remains for the device wafer. Alternatively, the splitting region may be located within the wide band gap semiconductor wafer so that the device wafer may comprise the complete epitaxial layer.

The splitting region may be located within a monocrystalline portion (e.g. a monocrystalline layer) of the wide band gap semiconductor wafer, for example. The device wafer may comprise monocrystalline wide band gap semiconductor material (e.g. the device wafer may be a monocrystalline semiconductor wafer). The device wafer may be a monocrystalline wide band gap semiconductor wafer, e.g. the device wafer may comprise less than 10% (or less than 5%, less than 3%, less than 1% or less than 0.5%) of non-monocrystalline semiconductor material, for example after splitting 130 the device wafer. For example, the device wafer may comprise the (e.g. monocrystalline) epitaxial layer and a (e.g. monocrystalline) portion of the split wide band gap semiconductor wafer.

Further, a remaining wafer may be obtained by splitting 130 the wide band gap semiconductor wafer. The remaining wafer may comprise the non-monocrystalline support layer. Further, the remaining layer may comprise a remaining portion of the wide band gap semiconductor wafer, e.g. a monocrystalline layer of the wide band gap semiconductor wafer. Splitting 130 may be performed after depositing 110 the non-monocrystalline support layer, for example.

For example, the device wafer may have a thickness of more than 2 times (or more than 3 times, more than 5 times or more than 10 times) a thickness of the remaining wafer. For example, a thickness of the remaining wide band gap semiconductor wafer of the remaining wafer may be at least 2 times a thickness of the split device wafer.

For example, providing the non-monocrystalline support layer may enable further splitting the remaining wafer or the monocrystalline wide band gap semiconductor wafer substrate of the remaining wafer. The non-monocrystalline support layer may provide mechanical support for the wide band gap semiconductor wafer and/or may increase the total thickness of the wide band gap semiconductor wafer to enable handling of the wide band gap semiconductor wafer. The non-monocrystalline support layer may enable further usage of the wide band gap semiconductor wafer substrate, e.g. the complete wide band gap semiconductor wafer substrate may be used. For example, in further splitting processes further device wafers may be formed. Using the complete wide band gap semiconductor wafer substrate may reduce costs, since the costs for a new device wafer, e.g. thin wide band gap semiconductor wafers, may be higher than the costs for forming the non-monocrystalline support layer. For example, the non-monocrystalline support layer may be easier and/or faster and/or cheaper to form than a monocrystalline wide band gap semiconductor wafer.

Splitting the wide band gap semiconductor wafer may be more complex than thinning a wafer by grinding, for example. However, splitting may enable to further use a remaining portion of the wide band gap semiconductor wafer, for example. Grinding may be used for thinning other materials, e.g. non-monocrystalline wafers or non-monocrystalline layers (e.g. amorphous layers), e.g. for economic reasons.

For example, a thermal expansion coefficient of the non-monocrystalline support layer may differ from a thermal expansion coefficient of the wide band gap semiconductor wafer by at most 10% (or by at most 5%, by at most 3%, by at most 1% or by at most 0.1%) of the thermal expansion coefficient of the wide band gap semiconductor wafer. By providing the non-monocrystalline support layer with a thermal expansion coefficient similar or equal to the thermal expansion coefficient of the wide band gap semiconductor wafer, deforming of the wide band gap semiconductor wafer supported by the non-monocrystalline support layer may be avoided. For example, the similar thermal expansion coefficients may enable processing the wide band gap semiconductor wafer supported by the non-monocrystalline support layer at different temperatures.

For example, the non-monocrystalline support layer may be deposited with a deposition rate of at least 40 µm/hour (or at least 50 µm/hour, at least 60 µm/hour, at least 80 µm/hour or at least 100 µm/hour). For example, chemical vapor deposition (CVD), laser CVD and/or Close Space Epitaxy may be used for depositing the non-monocrystalline support layer. For example, a high deposition rate may be usable as only a mechanical stability of the non-monocrystalline support layer may be required, but there might be no electrical requirements to the non-monocrystalline support layer. A high deposition rate may enable fast processing and thus may reduce manufacturing costs.

For example, a protective layer may be located at the front side of the wide band gap semiconductor wafer during depositing the non-monocrystalline support layer. The protective layer (e.g. a carbon cap) may be formed at the front side or deposited on the front side before depositing the non-monocrystalline support layer. The protective layer may be removed after depositing the non-monocrystalline support layer, for example to enable depositing the epitaxial layer at the front side. The protective layer may prevent growth of a layer at the front side of the wide band gap semiconductor wafer while depositing the non-monocrystalline support layer, for example.

For example, the non-monocrystalline support layer may be one of a poly-silicon carbide layer and a molybdenum layer, if the wide band gap semiconductor wafer is a silicon carbide wafer. For example, the non-monocrystalline support layer may comprise at least two sublayers of different materials. For example, the non-monocrystalline support layer may comprise a first sublayer of poly-silicon carbide and a second sublayer of molybdenum and/or carbon, for example graphite.

For example, a total thickness of the remaining wafer including the non-monocrystalline support layer (and e.g. a remaining portion of the wide band gap semiconductor wafer) may be at least 200 µm (or at least 300 µm, at least 400 µm, or at least 500 µm) and/or at most 1500 µm (or at most 1300 µm, at most 1000 µm, or at most 700 µm). For example, the non-monocrystalline support layer may be deposited with a predefined thickness so that a sufficient total thickness of the remaining wafer may be achieved after splitting the wide band gap semiconductor wafer. For example, the total thickness of the remaining wafer may be adapted by the deposition of the non-monocrystalline support layer to enable further processing the remaining wafer with standard semiconductor equipment.

For example, the method may comprise depositing a further non-monocrystalline support layer on the non-monocrystalline support layer of the remaining wafer, e.g. directly on the non-monocrystalline support layer of the remaining wafer. For example, after depositing the non-monocrystalline support layer, the wide band gap semiconductor wafer (or a respective remaining wafer) may be split several times to obtain several device wafers. The further non-monocrystalline support layer may be deposited, for example, if the thickness of a respective remaining wafer would be lower than the minimum total thickness of the wide band gap semiconductor wafer which is required for the processing of the wafer, e.g. after a splitting a further device wafer. Depositing the further non-monocrystalline support layer may enable further processing the respective remaining wafer, e.g. after splitting the further device wafer.

For example, a material of the further non-monocrystalline support layer may differ from a material of the non-monocrystalline support layer. For example, using different materials may facilitate depositing the respective non-monocrystalline support layer and/or may reduce costs of depositing the non-monocrystalline support layer.

For example, a thickness of the remaining wafer including the non-monocrystalline support layer and the further non-monocrystalline support layer may differ by at most 400 µm (or by at most 300 µm, or by at most 200 µm) from a thickness of the remaining wide band gap semiconductor wafer before splitting the wide band gap semiconductor wafer, e.g. before or after depositing the epitaxial layer. For example, the thickness of the further non-monocrystalline support layer may be similar to a thickness of the device wafer so that an overall thickness of the wide band gap semiconductor wafer or the respective remaining wafers may remain approximately constant while splitting device wafers from the wide band gap semiconductor wafer or the respective remaining wafers. For example, the thickness of the further non-monocrystalline support layer may depend on a thickness of the device wafer and/or a thickness of the epitaxial layer so that an overall thickness of the wide band gap semiconductor wafer may remain constant while splitting device wafers from the wide band gap semiconductor wafer. For example, after depositing a non-monocrystalline support layer, two or more device wafers may be split from the wide band gap semiconductor wafer and the further non-monocrystalline support layer may have a thickness depending on a total thickness of the two or more device wafers.

For example, the method may comprise depositing a further epitaxial layer at a front side of the remaining wafer. The method may further comprise splitting the remaining wafer along a further splitting region to obtain a further device wafer comprising the further epitaxial layer, and to obtain a further remaining wafer comprising the non-monocrystalline support layer. The method may comprise depositing a further non-monocrystalline support layer on the non-monocrystalline support layer of the further remaining wafer, for example after the further splitting of the remaining wafer. The further non-monocrystalline support layer may have a thickness of at least 70% (or at least 80% or at least 90%) and/or of at most 130% (or of at most 120% or of at most 110%) of the total thickness of the further device wafer. The thickness of the device wafer may be at most 300 µm (or at most 200 µm, at most 110 µm, at most 50 µm or at most 20 µm), for example. For example, the further non-monocrystalline support layer may be deposited before splitting the remaining wafer to obtain the further device wafer.

According to an example, the method may further comprise forming a doping region of a wide band gap semiconductor device in the wide band gap semiconductor wafer, e.g. in the epitaxial layer. The doping region may be formed after depositing the non-monocrystalline support layer. The doping region may be an anode region or cathode region of a diode or a source region, a body region, a drain region, an emitter region, a base region or a collector region of a transistor (e.g. MOSFET or IGBT). The doping region may be an n-doped or p-doped region. For example, the doping region may be formed before splitting the wide band gap semiconductor wafer. For example, a plurality of doping regions of a corresponding plurality of wide band gap semiconductor devices to be formed on the wide band gap semiconductor wafer may be formed simultaneously.

For example, the method may further comprise forming a metallization structure of the wide band gap semiconductor device at the front side of the wide band gap semiconductor wafer, e.g. after depositing the non-monocrystalline support layer. For example, respective metallization structures for the plurality of wide band gap semiconductor devices may be formed. For example, the metallization structure may be formed before splitting the wide band gap semiconductor wafer.

For example, semiconductor processes may be performed at temperatures of more than 1000° C. before splitting. For example, the device wafer is processed at temperatures of at most 1000° C. after splitting to avoid altering of structures formed at the front side before splitting.

For example, one or more wide band gap semiconductor devices may be formed on the wide band gap semiconductor wafer. For example, each wide band gap semiconductor device comprises a transistor. At least one of a gate trench, and a gate electrode of the transistor may be formed before splitting.

The transistor may be a field effect transistor (e.g. a metal oxide semiconductor field effect transistor (MOSFET) or an insulated gate bipolar transistor (IGBT)). The gate of the transistor may be located in a gate trench extending into the wide band gap semiconductor substrate or may be located on a lateral surface of the wide band gap semiconductor substrate. The transistor may comprise one or more transistor cells. For example, the wide band gap semiconductor substrate may comprise one or more source regions, one or more body regions and a drift region of the transistor. The one or more source regions and the drift region may each be of a first conductivity type (e.g. n-doped). The one or more body regions may be of a second conductivity type (e.g. p-doped).

The transistor may be a vertical transistor structure conducting current between a front side surface of the wide band gap semiconductor substrate and a back side surface of the wide band gap semiconductor substrate. For example, the transistor of the wide band gap semiconductor device may comprise a plurality of source doping regions connected to a source wiring structure, a plurality of gate electrodes or a gate electrode grid connected to a gate wiring structure and a back side drain metallization or back side collector metallization.

For example, the wide band gap semiconductor wafer may be either one of: a wide band gap semiconductor base substrate, a wide band gap semiconductor base substrate with a wide band gap semiconductor epitaxial layer grown on the wide band gap semiconductor base substrate or a wide band gap semiconductor epitaxial layer. The wide band gap semiconductor wafer may be a monocrystalline wafer or may comprise at least a monocrystalline wide band gap semiconductor layer.

For example, the wide band gap semiconductor wafer may have a band gap larger than the band gap of silicon (1.1 eV). In particular, the wide band gap semiconductor wafer has a band gap larger than 2 eV, for example larger than 3 eV. For example, the wide band gap semiconductor wafer may be a silicon carbide semiconductor (SiC) wafer, or a gallium arsenide (GaAs) semiconductor wafer, or a gallium nitride (GaN) semiconductor wafer.

The front side of the wide band gap semiconductor wafer may be the side used to implement more sophisticated and complex structures (e.g. gates of transistors) than at the back side of the semiconductor substrate. The process parameters (e.g. temperature) and the handling may be limited for forming structures at the back side to avoid altering of structures formed at the front side.

A wide band gap semiconductor device to be formed on the wide band gap semiconductor wafer may be a power semiconductor device. A power semiconductor device or an electrical structure (e.g. transistor arrangement of the semiconductor device) of the power semiconductor device may have a breakdown voltage or blocking voltage of more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

Figure 2:
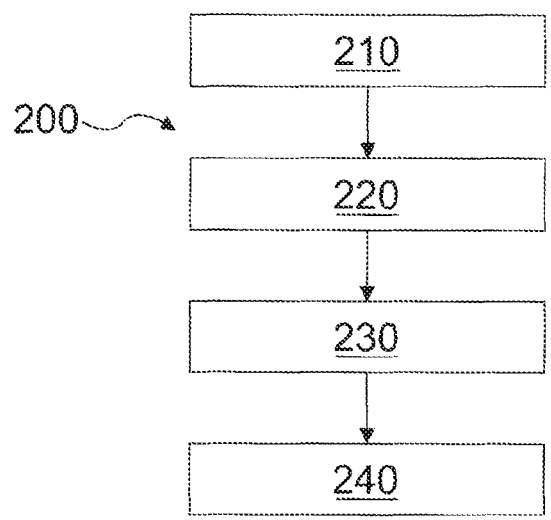
FIG. 2 shows a flow chart of a method for forming a plurality of thin wide band gap semiconductor wafers.

FIG. 2 shows a flow chart of a method 200 for forming a plurality of thin wide band gap semiconductor wafers. The method 200 may comprise depositing 210 a first non-monocrystalline support layer on a wide band gap semiconductor boule. The non-monocrystalline support layer may be a polycrystalline layer and/or an amorphous layer, for example.

Further, the method 200 may comprise separating 220 (e.g. splitting 220 and/or sawing 220) the wide band gap semiconductor boule along a first separating region (e.g. splitting region or sawing region) to obtain a first thin wide band gap semiconductor wafer. Alternatively or additionally to splitting 220, the first thin wide band gap semiconductor wafer may be obtained by sawing 220 the wide band gap semiconductor boule, e.g. partly. The thin wide band gap semiconductor wafer may comprise the non-monocrystalline support layer and a thin wide band gap semiconductor layer. A thickness of the non-monocrystalline support layer may be at least 100 µm (or at least 150 µm), for example. The thin wide band gap semiconductor layer may have a thickness of at least 50 µm (of at least 100 µm or of at least 250 µm) and/or at most 500 µm, for example. Further, a first remaining wide band gap semiconductor boule may be obtained. For example, a thickness of the wide band gap semiconductor boule may be at least 2 times (or at least 5 times, or at least 10 times) a thickness of the thin wide band gap semiconductor layer.

Further, the method 200 may comprise depositing 230 a further (e.g. a second) non-monocrystalline support layer on the first remaining wide band gap semiconductor boule, e.g. comprising the non-monocrystalline support layer. The further non-monocrystalline support layer may be deposited 230 after separating 220 (e.g. splitting or sawing) the wide band gap semiconductor boule along the first separating region, for example.

The method 200 may further comprise separating 240 (e.g. splitting 240 or sawing 240) the first remaining wide band gap semiconductor boule along a second separating region (e.g. splitting region or sawing region). For example, a further (e.g. a second) thin wide band gap semiconductor wafer and a further (e.g. a second) remaining wide band gap semiconductor boule may be obtained. The further thin wide band gap semiconductor wafer may comprise the further non-monocrystalline support layer and a further thin wide band gap semiconductor layer, for example. This process sequence may be repeated several times.

For example, a further (e.g. a third) non-monocrystalline support layer may be deposited on the second remaining wide band gap semiconductor boule. The second remaining wide band gap semiconductor boule may be separated (e.g. split or sawed) along a further separating region (e.g. splitting region or sawing region) to obtain a further (e.g. a third) thin wide band gap semiconductor wafer, and a further remaining wide band gap semiconductor boule, for example. The further thin wide band gap semiconductor wafer may comprise the further non-monocrystalline support layer and a thin wide band gap semiconductor layer. Consequently, further non-monocrystalline support layers may be deposited on respective further remaining wide band gap semiconductor boules to form a plurality of thin wide band gap semiconductor wafers. The process may be repeated, e.g. several times, e.g. until a thickness of a remaining wide band gap semiconductor boule is too small to split the remaining wide band gap semiconductor boule, for example if it is thinner than the thin wide band gap semiconductor wafer.

The method 200 may be used to provide or split or saw thin wide band gap semiconductor wafers from a wide band gap semiconductor boule. Thereby, the amount of wide band gap semiconductor material required for a thin wide band gap semiconductor wafer may be reduced. It may be possible that mechanical stability (e.g. for further processing) is provided by the non-monocrystalline support layer. The wide band gap semiconductor boule may have a thickness of at least 2 mm (or of at least 3 mm or of at least 5 mm) for example. The wide band gap semiconductor boule may be a wide band gap semiconductor ingot and/or a thick wide band gap semiconductor wafer. For example, the wide band gap semiconductor boule may have the shape of an elongated rod or an elongated bar. The method 200 may enable providing thin wide band gap semiconductor wafers while decreasing a needed amount of wide band gap semiconductor wafer material, for example.

More details and aspects are mentioned in connection with the embodiments described above or below. The embodiments shown in FIG. 2 may comprise one or more optional additional features corresponding to one or more aspects mentioned in connection with the proposed concept or one or more embodiments described above or below (e.g. FIGS. 1 and 3-4*i*).

Figure 3:
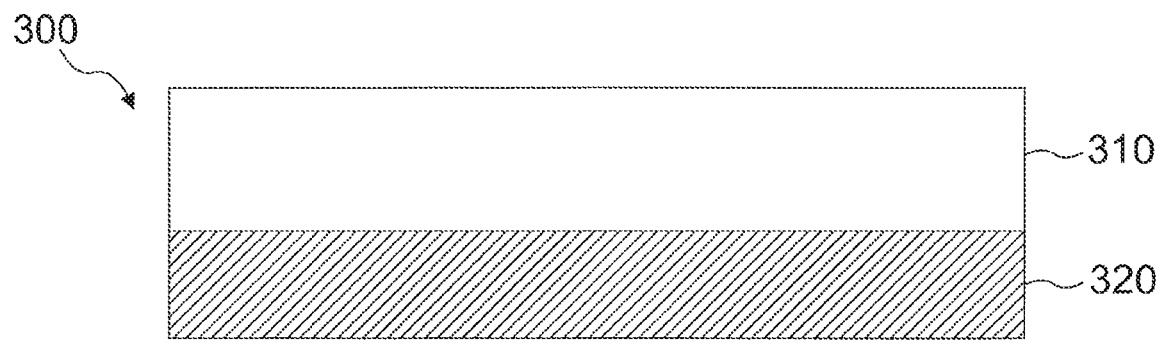
FIG. 3 shows schematic cross section of a wide band gap semiconductor wafer with a non-monocrystalline support layer.

FIG. 3 shows an illustration of a wide band gap semiconductor wafer 300. The wide band gap semiconductor wafer 300 may comprise a monocrystalline wide band gap semiconductor layer 310. A thickness of the monocrystalline wide band gap semiconductor layer may be at least 50 µm (or at least 70 µm, at least 90 µm, at least 100 µm, at least 150 µm, at least 250 µm, at least 350 µm, at least 500 µm, at least 700 µm or at least 1000 µm) and/or at most 2000 µm (or at most 1300 µm, at most 1000 µm or at most 800 µm). For example, the monocrystalline wide band gap semiconductor layer having a thickness of more than 300 µm may be used for splitting a plurality of thin monocrystalline semiconductor wafers from the monocrystalline wide band gap semiconductor layer 310.

The wide band gap semiconductor wafer 300 may further comprise a non-monocrystalline support layer. The non-monocrystalline support layer may be a crystalline layer, e.g. an amorphous layer or a poly-crystalline layer. For example, the non-monocrystalline support layer may comprise a semiconductor material, e.g. a wide band gap semiconductor. The non-monocrystalline support layer may be located at a surface of the monocrystalline semiconductor layer. A thickness of the non-monocrystalline support layer may be at least 100 µm (or at least 150 µm, at least 200 µm, at least 250 µm, at least 300 µm, at least 400 µm, at least 500 µm, at least 700 µm or at least 1000 µm) and/or at most 1500 µm (or at most 1200 µm, at most 1000 µm, at most 750 µm at most 500 µm, at most 350 µm or at most 200 µm). A thickness of the non-monocrystalline support layer of more than 300 µm (e.g. more than 350 µm) may for example enable splitting further thin semiconductor wafers from the monocrystalline wide band gap semiconductor layer 310.

For example, the non-monocrystalline support layer increases a total thickness of the wide band gap semiconductor wafer 300 and may mechanically support thin monocrystalline wide band gap semiconductor layers, e.g. with a thickness of the monocrystalline wide band gap semiconductor layer smaller than 250 µm. For example, the total thickness of the wide band gap semiconductor wafer 300 is at least 200 µm (or at least 250 µm) and/or at most 1500 µm (or at most 1300 µm). The total thickness of the wide band gap semiconductor wafer 300 may enable processing the wide band gap semiconductor wafer 300 using standard semiconductor equipment.

Providing the non-monocrystalline support layer may enable processing and/or using the complete monocrystalline wide band gap semiconductor layer. The monocrystalline wide band gap semiconductor layer may comprise an expensive material whereas the material of the non-monocrystalline support layer may be less expensive. For example, the wide band gap semiconductor wafer 300 may be a silicon carbide wafer and the monocrystalline wide band gap semiconductor layer may be a silicon carbide layer. For example, the non-monocrystalline support layer may be a poly silicon carbide layer. By providing the non-monocrystalline support layer, the monocrystalline wide band gap semiconductor layer may be completely used or processed, e.g. by splitting thin wide band gap semiconductor wafers from the monocrystalline wide band gap semiconductor layer. For this, additional poly silicon carbide layers may be deposited on the supporting layer as soon as the critical thickness for the further processing of the wafer is reached. A non-usable remaining part of the monocrystalline wide band gap semiconductor layer may be reduced (for example to a thickness of less than 60 µm or of less than 30 µm) so that by using the monocrystalline wide band gap semiconductor layer more efficiently, overall manufacturing costs of thin wide band gap semiconductor wafers may be reduced, for example.

For example, a thermal expansion coefficient of at least a part of the non-monocrystalline support layer may differ from a thermal expansion coefficient of the monocrystalline wide band gap semiconductor layer by at most 10% (or by at most 5%, by at most 3%, by at most 1% or by at most 0.1%) of the thermal expansion coefficient of the monocrystalline wide band gap semiconductor layer. The part of the non-monocrystalline support layer may be a sublayer of the non-monocrystalline support layer, for example. The similar thermal expansion coefficient of the two layers may result in preventing wafer bow of the wide band gap semiconductor wafer 300, e.g. when processing the wide band gap semiconductor wafer 300 at different temperatures.

For example, a first sublayer of the non-monocrystalline support layer may comprise a first material and a second sublayer of the non-monocrystalline support layer may comprise a second material, wherein the first material may differ from the second material. For example, the first and second material may have different thermal expansion coefficients. For example, the thermal expansion coefficient of the sublayer next to the monocrystalline wide band gap semiconductor layer may differ from the thermal expansion coefficient of the monocrystalline wide band gap semiconductor layer by at most 10% of the thermal expansion coefficient of the monocrystalline wide band gap semiconductor layer, and a thermal expansion coefficient of another sublayer may differ from the thermal expansion coefficient of the monocrystalline wide band gap semiconductor layer by more than 10%, for example.

More details and aspects are mentioned in connection with the embodiments described above or below. The embodiments shown in FIG. 3 may comprise one or more optional additional features corresponding to one or more aspects mentioned in connection with the proposed concept or one or more embodiments described above or below (e.g. FIGS. 1-2 and 4*a*-4*i*).

Figure 4A:
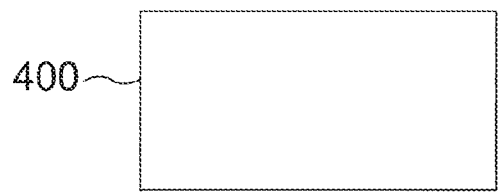
Figure 4B:
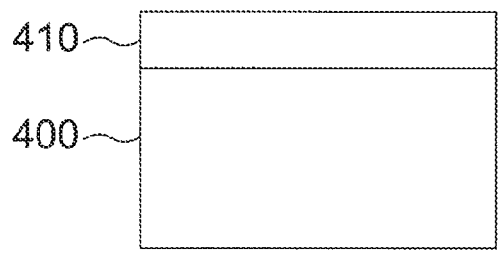
Figure 4C:
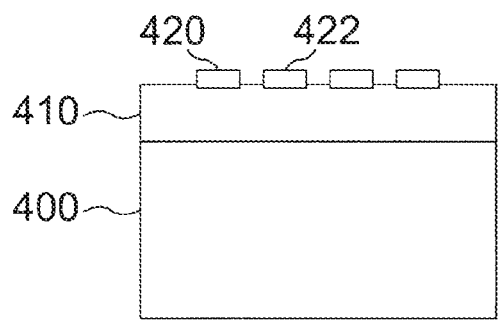

FIGS. 4*a* to 4*i* show an example of a method for processing a wide band gap semiconductor wafer 400. The wide band gap semiconductor wafer 400 may be provided as start wafer. An epitaxial layer 410 may be deposited on the start wafer. For example, front side structures or metallization structures 420, 422 may be formed on the epitaxial layer 410. For example, after forming the front side structures, e.g. to provide semiconductor devices, the wide band gap semiconductor wafer 400 may be split. For example, as shown in FIG. 4d, a remaining bulk wafer 430 may be obtained after splitting, the remaining bulk wafer 430 comprising at least a first part of the start wafer. For example, a device wafer 440 may be obtained after splitting. The device wafer 440 may comprise the epitaxial layer 410 and the metallization structures 420, 422. For example, the device wafer 440 may further comprise a second part of the of the start wafer. The second part of the start wafer may be thinner than the epitaxial layer 410, for example.

The bulk wafer 430 may be turned around so that a front side 450 of the bulk wafer 430 faces downwards. The bulk wafer 430 may be thickened by a support layer 460 formed by deposition at a back side of the bulk wafer 430 opposite to the front side 450. The bulk wafer 430 and the support layer 460 may form a new start wafer 470. For example, the new start wafer 470 may be turned around so that the front side 450 faces upwards, e.g. to enable further processing of the front side. A process for a reduction of the surface roughness may be performed on the first side 450, like e.g. CMP, etching, polishing. A further epitaxial layer may be formed at the front side 450, e.g. after a post-processing of the new start wafer 470, and an iteration of the method may be performed, wherein the new start wafer 470 may substitute the start wafer 400.

More details and aspects are mentioned in connection with the embodiments described above or below. The embodiments shown in FIGS. 4a to 4i may comprise one or more optional additional features corresponding to one or more aspects mentioned in connection with the proposed concept or one or more embodiments described above or below (e.g. FIGS. 1-3).

For example, a limitation regarding reuse cycles may occur for some concepts concerning splitting and reuse, and it might not be possible to completely process a substrate of the thin semiconductor wafer. For example, a remaining wafer part may have a thickness lower than 250 μm after splitting the semiconductor wafer. Due to its low thickness it might not be possible to further use the remaining part. To guarantee a required thickness of the remaining part, e.g. larger than 250 μm, a thick epitaxial layer may be grown on the semiconductor wafer before splitting, the epitaxial layer resulting in increased costs. There may be a demand for improved concepts for processing semiconductor wafers.

According to other concepts, it might not be possible to completely process a wafer below a thickness of 250 μm. For concepts which aim at splitting and/or reuse of the wafer, thus a limitation regarding re-use cycles may result. E.g., a start substrate (e.g. the start wafer) has a start thickness of 350 μm, and a 110 μm split thickness may be used. According to some concepts, a maximum of 2× splitting (e.g. incl.>30 μm Epi (Epi: epitaxial) deposition) of the start substrate may be achieved, even if a rest of the bulk could still be used.

For example, by using the provided concepts, also the remaining part of the bulk may be completely used. A proposed method e.g. may provide the use of a temperature-resistant and/or low-cost deposition on the wafer back side. This deposition e.g. may only serve for thickening the disc, e.g. the wafer or the substrate, and might have no electric relevance, as this layer is e.g. not found again in the resulting device wafer (which is split off, for example). Still, this additional layer might not negatively influence the manufacturability of the wafers during processing, both regarding wafer bow/warp and roughness.

For example, the deposition of poly silicon carbide (poly-SiC) on the wafer back side may take place from the gas phase, e.g. similar gas systems may be used as in SiC epitaxy (e.g. hydrocarbons, silanes and/or silane derivatives and/or gases containing carbon and silicon (Si) in the correct ratio). Also the use of chlorine (Cl)—containing gases may be sensible (e.g. trichlorosilane), e.g. in order to acquire high surface diffusion rates and consequently high growth rates. Further alternatives may be e.g. the use of laser chemical vapor deposition (CVD) or Close Space Epitaxy.

For example, the monocrystalline wafer front side may be protected by a removable cover layer (e.g. Carbon Cap), e.g. to suppress an undesirable growth there. A possible implementation would be, e.g. by adapting the used processing equipment, to select the overall thickness of the start wafer to be clearly thicker than 350 micrometers and possibly minimize the wafer bow and facilitate wafer handling. In this respect, at the start of processing the initial wafer the same may be provided with a poly silicon carbide layer of a corresponding thickness which may be increased during the later re-use processes so that the wafer may be re-used several times, for example. This process may be repeated until the original mono-crystalline SiC layer is used up. Thickening might not have to be executed after every splitting process, e.g. in case of poly silicon carbide, but e.g. only when used processing equipment makes it necessary.

An example relates to a method for thickening a SiC wafer. An aspect may relate to the wafer back-side deposition of a layer compatible with SiC processes to consequently prevent falling short of the critical wafer thickness with SiC wafer re-use concepts by means of splitting off layers, for example. This split-off layer may not only fulfil thermal but also mechanical requirements. An example for such a layer may be a poly SiC layer.

Using the proposed concepts may enable to reduce manufacturing costs for SiC technologies as a substrate may be re-used several times. Proposed concepts may also be integrated for even thinner split layers and/or scalable to different wafer diameters.

Thick epitaxial layer depositions on the wafer front side may enable a thickening of the discs/layers. Compared to other concepts, proposed concepts may be easily implemented and/or may be easy to include into production process and/or may enable the implementation of currently required testing concepts.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A method for processing a wide band gap semiconductor wafer, the method comprising:
   depositing a non-monocrystalline support layer comprising semiconductor material at a back side of a wide band gap semiconductor wafer, the wide band gap semiconductor wafer having a band gap larger than the band gap of silicon;
   depositing an epitaxial layer at a front side of the wide band gap semiconductor wafer; and
   splitting the wide band gap semiconductor wafer along a splitting region to obtain a device wafer comprising at least a part of the epitaxial layer, and a remaining wafer comprising the non-monocrystalline support layer.

2. The method of claim 1, wherein a thermal expansion coefficient of the non-monocrystalline support layer differs from a thermal expansion coefficient of the wide band gap semiconductor wafer by at most 10% of the thermal expansion coefficient of the wide band gap semiconductor wafer.

3. The method of claim 1, wherein the non-monocrystalline support layer is deposited at a deposition rate of at least 50 μm/hour.

4. The method of claim 1, wherein the non-monocrystalline support layer is a poly-silicon carbide layer or a molybdenum layer.

5. The method of claim 1, wherein a total thickness of the remaining wafer including the non-monocrystalline support layer is at least 200 μm and at most 1500 μm.

6. The method of claim 1, wherein a protective layer is located at the front side of the wide band gap semiconductor wafer during the depositing of the non-monocrystalline support layer.

7. The method of claim 1, further comprising:
   depositing a further non-monocrystalline support layer on the non-monocrystalline support layer of the remaining wafer.

8. The method of claim 7, wherein a material of the further non-monocrystalline support layer differs from a material of the non-monocrystalline support layer.

9. The method of claim 7, wherein a thickness of the remaining wafer including the non-monocrystalline support layer and the further non-monocrystalline support layer differs by at most 300 μm from a thickness of the wide band gap semiconductor wafer before the splitting of the wide band gap semiconductor wafer.

10. The method of claim 7, wherein the further non-monocrystalline support layer has a thickness of at least 90% and of at most 110% of the total thickness of the further device wafer.

11. The method of claim 1, further comprising:
    depositing a further epitaxial layer at a front side of the remaining wafer; and
    splitting the remaining wafer along a further splitting region to obtain a further device wafer comprising the further epitaxial layer and a further remaining wafer comprising the non-monocrystalline support layer.

12. The method of claim 1, further comprising:
    forming a doping region of a wide band gap semiconductor device in the wide band gap semiconductor wafer after the depositing of the non-monocrystalline support layer.

13. The method of claim 1, further comprising:
    forming a metallization structure of the wide band gap semiconductor device at the front side of the wide band gap semiconductor wafer after the depositing of the non-monocrystalline support layer.

14. The method of claim 1, wherein at least one of a gate trench and a gate electrode of a transistor is formed at the front side of the wide band gap semiconductor wafer before the splitting.

15. The method of claim 1, wherein the device wafer is processed at temperatures of at most 1000° C. after the splitting.

16. The method of claim 1, wherein the wide band gap semiconductor wafer is a silicon carbide wafer.

17. A method for forming a plurality of thin wide band gap semiconductor wafers, the method comprising:
    depositing a first non-monocrystalline support layer comprising semiconductor material on a wide band gap semiconductor boule, the wide band gap semiconductor boule having a band gap larger than the band gap of silicon;
    separating the wide band gap semiconductor boule along a first separating region to obtain a first thin wide band gap semiconductor wafer and a first remaining wide band gap semiconductor boule, the first thin wide band gap semiconductor wafer comprising the first non-monocrystalline support layer and a thin wide band gap semiconductor layer, a thickness of the wide band gap semiconductor boule being at least 2 times a thickness of the thin wide band gap semiconductor layer;
    depositing a second non-monocrystalline support layer on the first remaining wide band gap semiconductor boule; and
    separating the first remaining wide band gap semiconductor boule along a second separating region to obtain a second thin wide band gap semiconductor wafer and a second remaining wide band gap semiconductor boule, the second thin wide band gap semiconductor wafer comprising the second non-monocrystalline support layer and a thin wide band gap semiconductor layer.

18. The method of claim 17, further comprising:
    depositing a third non-monocrystalline support layer on the second remaining wide band gap semiconductor boule; and
    separating the second remaining wide band gap semiconductor boule along a third separating region to obtain a third thin wide band gap semiconductor wafer and a third remaining wide band gap semiconductor boule, the third thin wide band gap semiconductor wafer comprising the third non-monocrystalline support layer and a thin wide band gap semiconductor layer.

19. The method of claim 17, wherein the separating comprises at least one of splitting and sawing.

* * * * *